United States Patent [19]

Westman

[11] Patent Number: 4,580,070
[45] Date of Patent: Apr. 1, 1986

[54] LOW POWER SIGNAL DETECTOR

[75] Inventor: Dean Westman, Minneapolis, Minn.

[73] Assignee: Honeywell Inc., Minneapolis, Minn.

[21] Appl. No.: 477,296

[22] Filed: Mar. 21, 1983

[51] Int. Cl.[4] .................... H03K 5/153; H03K 17/56
[52] U.S. Cl. ................................... 307/350; 307/246; 307/571; 307/351
[58] Field of Search ............... 307/350, 530, 351, 352, 307/353, 362, 304, 246, 451, 481, 496, 497, 585, 475, 580, 571, 200 B

[56] References Cited

U.S. PATENT DOCUMENTS

| | | | |
|---|---|---|---|
| 3,631,528 | 12/1971 | Green | 307/585 |
| 3,656,000 | 4/1972 | Neathery, Jr. | 307/246 |
| 3,775,693 | 11/1973 | Proebsting | 307/304 |
| 3,805,095 | 4/1974 | Lee et al. | 307/304 |
| 3,898,479 | 8/1975 | Proebsting | 307/246 |
| 3,912,948 | 10/1975 | Bapat | 307/279 |
| 3,932,773 | 1/1976 | Lüscher et al. | 307/270 |
| 3,976,984 | 8/1976 | Hirasawa | 307/279 |
| 4,256,976 | 4/1981 | Maggi | 307/246 |
| 4,321,561 | 3/1982 | Payne et al. | 331/111 |
| 4,342,928 | 8/1982 | Gschwendtner et al. | 307/475 |

Primary Examiner—Stanley D. Miller
Assistant Examiner—Timothy P. Callahan
Attorney, Agent, or Firm—Robert A. Pajak

[57] ABSTRACT

A low power signal detector circuit in which a first current limiting device supplies current or draws currents to maintain the voltage across an integrating capacitance to a selected value. A second and variable current limiting means responsive to the RF input signal amplitude is coupled to a common junction of the integrating capacitance and the first current limiting device so as to oppositely affect the charge on the capacitance as provided by the first current limiting device dependent upon the input signal value with respect to a preselected input signal voltage threshold amplitude. The first current limiting device and the variable current limiting device are conveniently implemented using metal-oxide-semiconductor-field-effect transistors operated in the weak-inversion mode so as to maintain power consumption at a minimum.

13 Claims, 4 Drawing Figures

LOW POWER SIGNAL DETECTOR

BACKGROUND OF THE INVENTION

The present invention relates to an alternating voltage amplitude detector, more particularly to a low power signal detector comprising metal-oxide-semiconductor field-effect transistors.

An access control system as shown and described in U.S. Pat. No. 4,353,064, entitled "Battery Operated Access Control Card," assigned to the assignee of the present invention, utilizes an access control card including a receiving circuit coupled to an antenna for receiving radio frequency signals through space. The aforementioned patent utilizes an arithmetic shift key (ASK) approach as a means to transfer coded information from the transmitter to the access card. Such a card contains a low power battery and therefore necessitates a low power signal detector to keep power consumption at a minimum particularly when not in use. Further, such a signal detector should have a threshold minimum below which signal is not detected, and an access delay time for responding to an RF signal. A threshold detector coupled to the output of the signal detector can then provide pulses of information to subsequent signal processing circuits for code checking and the like in an access control system.

The receiver portion of the circuit needs to be powered up continuously or by continuous sampling so as to be responsive when the card is in actual use for obtaining access to a controlled security area. Therefore, it is imperative that such a receiver be constructed of a design which is of very low power consumption. Metal-oxide-semiconductor field-effect transistors are well known low power devices. They are particularly of low power when the MOS transistor is reduced below the threshold voltage defined by the usual strong inversion characteristic. In this mode of operation, the channel current is an exponential function of the gate-source voltage—i.e. below the saturated channel current level. An analysis of the weak inversion mode operation of MOS transistors is taught in a paper entitled, "CMOS Analog Integrated Circuits Based On Weak-Inversion Operation," by Vittoz et al., IEEE Journal of Solid State Circuits, Volume SE-12 No. 3, June 1977.

SUMMARY OF THE INVENTION

The invention provides a low power signal detector circuit in which a first current limiting device supplies current or draws currents to maintain the voltage across an integrating capacitance to a selected value. A second and variable current limiting means responsive to the RF input signal amplitude is coupled to a common junction of the integrating capacitance and the first current limiting device so as to oppositely affect the charge on the capacitance as provided by the first current limiting device dependent upon the input signal value with respect to a preselected input signal voltage threshold amplitude. The first current limiting device and the variable current limiting device are conveniently implemented using metal-oxide-semiconductor field-effect transistors operated in the weak-inversion mode so as to maintain power consumption at a minimum.

DESCRIPTION OF THE PREFERRED EMBODIMENTS

Figures 1, 2:
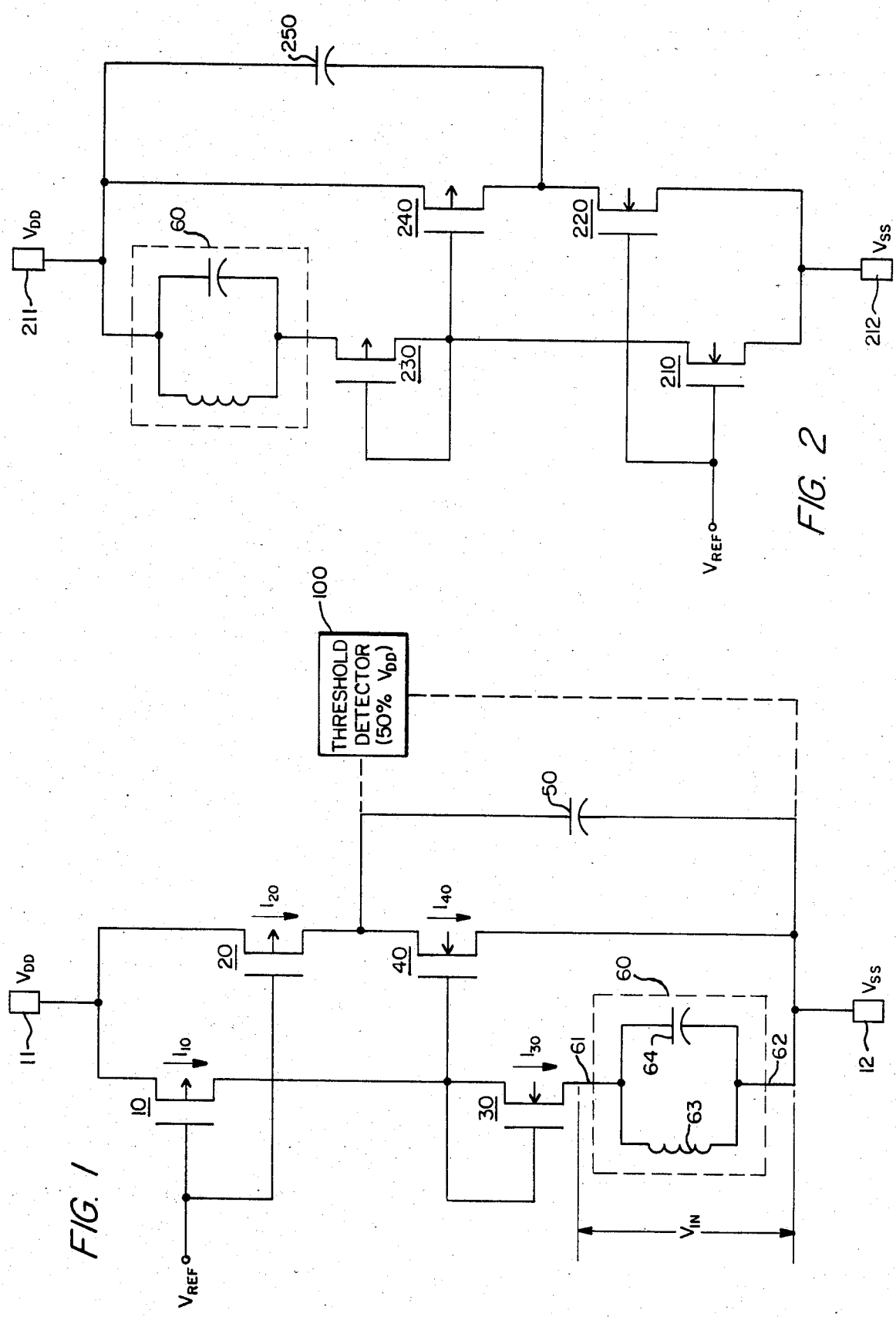
FIG. 1 shows a schematic diagram of one embodiment of a CMOS circuit of the present invention.
FIG. 2 shows a schematic diagram of another circuit embodiment of the present invention.

Shown in FIG. 1 is a signal detector using metal-oxide-semiconductor field-effect transistor technology. The circuit shown in FIG. 1 can be fabricated in a monolithic integrated circuit by relying on any suitable fabrication process used for fabricating CMOS chips several of which are well known.

Referring now to FIG. 1, there shown are CMOS field effect transistors 10 and 20 having their gate regions connected in common and connected to a first potential reference source, $V_{REF}$ established between the common gate connections and interconnection means 11. The source regions of transistors 10 and 20 are electrically connected to a circuit interconnection means 11 which is adapted to be electrically connected to a positive potential source $V_{DD}$. Further, there shown are CMOS field effect transistors 30 and 40. The gate and source region of transistor 30 and the gate region of transistor 40 and the drain region of transistor 10 are electrically connected in common. The drain regions of transistors 20 and 40 are electrically connected in common with a first plate region of a capacitance 50. The source of transistor 40 and the second plate region of capacitance 50 are electrically connected to interconnection means 12 adapted to be electrically connected to a second electrical power supply designated $V_{SS}$. Transistors 10 and 20 are shown as PMOS devices having the channel region thereof of a first conductivity type, namely n-type. On the other hand, transistors 30 and 40 are shown as NMOS devices having the channel regions thereof being a second conductivity type, namely p-type. These transistors may be formed on a common substrate with capacitance 50 as will be further detailed later.

The circuit of FIG. 1 is responsive to a circuit means 60 for providing an input voltage, $V_{IN}$ between first and second terminating means 61 and 62. First terminating means 61 is electrically connected to the source of transistor 30, and second terminating means 62 is electrically connected to interconnection means 12. The nature of circuit means 60 is a low impedance voltage source having a negligible impedance with respect to the remainder of the circuit.

As illustrated in FIG. 1, one example of circuit means 60 is an LC tank circuit comprising inductance 63 and capacitor 64. Inductance 63 functions as an electromagnetic signal antenna like that shown in U.S. Pat. No. 4,353,064. Capacitance 64 in combination with inductance 63 forms a tuned tank circuit for frequency and bandwidth selection. Of course, inductance 63 is intended to have a low resistance.

In the following exposition, it will be assumed that $V_{DD}$ is a positive potential source with respect to ground, and that $V_{SS}$ is a zero potential source and interconnection means 12 is defined to be at ground. In these circumstances transistors 10 and 20 function as current limiting devices in which the currents through the channels thereof are a function of the potential reference source. The current flowing through transistor 10 identified as $I_{10}$ may be mathematically described by equation (1) assuming that the reference potential source is sufficiently low to operate transistor 10 in the weak-inversion mode, i.e. below the threshold voltage defined by the usual strong inversion characteristic.

$$I_{10} \stackrel{\Delta}{=} \frac{W_{10}}{L_{10}} \beta e^{\frac{V_{ref} - V_t}{nU_T}} \quad (1)$$

where
W/L = the geometrical shape factor of the transistor (effective width over effective length of the channel—the subscript indicating transistor number)
$\beta$ = a function of the oxide capacitance per unit area
$U_T = kT/q$ (26 mv), and
n = process related constant as taught in the above referenced publication
$V_T$ = transistor threshold voltage.

Current through transistor 20, $I_{20}$, may be mathematically written as a function of current $I_{10}$ by $$I_{20} = \frac{W_{20}}{L_{20}} \frac{L_{10}}{W_{10}} I_{10} = R_1 I_{10} \quad (2)$$

where $$R_1 = \frac{W_{20}}{L_{20}} \cdot \frac{L_{10}}{W_{10}}$$

As before, and hereafter, W and L subscripts indicate transistor number channel width and length. Further, $\beta$ and $V_T$ are assured to be the same for transistors of the same conductivity type. This is a valid assumption for similar transistors fabricated at the same time in the same manner of fabrication as is well known.

Transistor 40 functions as a variable current limiting means for drawing current through the channel of transistor 40. The gate voltage of transistor 40 is equal to the gate-source voltage of transistor 30 plus the circuit means voltage $V_{IN}$. The current limit, $I_{40}$, which may be allowed to flow from drain to source of transistor 40 may be mathematically described as follows:

$$I_{40} = \frac{W_{40}}{L_{40}} \beta e^{\left\{\frac{V_{GS30} + V_{IN} - V_T}{nU_T}\right\}} \quad (3)$$

where
n equals the process related constant, but $$I_{30} = \frac{W_{30}}{L_{30}} \beta e^{\frac{V_{GS30} - V_T}{nU_T}} \quad (4)$$

therefore, $$I_{40} = I_{30} \frac{W_{40}}{L_{40}} \frac{L_{30}}{W_{30}} e^{\frac{V_{in}}{nU_T}} = I_{30} R_2 e^{\frac{V_{IN}}{nU_T}} \quad (5)$$

where $$R_2 = \frac{W_{40}}{L_{40}} \cdot \frac{L_{30}}{W_{30}}$$

Assuming the situation where the input voltage $V_{IN}$ is such that transistor 40 can draw all the current supplied by transistor 20 and that the input voltage is a sinusoid expressed by $V_A \cos \omega t$, the average current through transistor 40 may be expressed as $$\overline{I_{40}} = I_{10} R_2 F(x) \quad (6)$$

since $I_{30} = I_{10}$
where F(x) is a zero order Modified Bessel Function (Communication Circuits Analysis and Design, Clark and Hess, 1977) of argument X where X is the value of $V_A/nU_T$. The voltage across capacitance 50 (i.e. drain-source voltage of transistor 40) may be expressed as:

$$V_c(t) = V_c(t = 0) + \left(\frac{I_{20} \Delta t - \overline{I_{40}} \Delta t}{C}\right) \quad (7)$$

where $\overline{I_{40}}$ is the average transistor 40 channel current.

Consider the situation when the input voltage amplitude, $V_A$, is zero and that $F_x(0)$ is one and the equalities set forth in equation (8) are true.

$$R_1 > R_2 \{F(X = V_A = 0)\} = R_2 \{1\}, \text{ and} \quad (8)$$

$$R_1 < R_2 F(x = V_x) \text{ where } V_x = \frac{V_{ACQUIRE}}{nU_T}$$

In these circumstances, transistor 40 is unable to draw all of the current that may be supplied by the current limit established by transistor 20. Accordingly, the difference between the current supplied by transistor 20 and the current drawn by transistor 40 charges capacitance 50 to a potential approximately equal to $V_{DD}$. The current difference in these circumstances determines the rate of increase in voltage on capacitor 50.

On the other hand, if $V_A$ is increased to the threshold voltage, $V_{ACQUIRE}$, as expressed in equation (8), transistor 40 is able to draw a current substantially equal to the current limit established by transistor 20. At this equilibrium point, namely at the threshold or "acquire" voltage, the voltage across capacitance 50 will remain near $V_{DD}$. However, if $V_A$ increases somewhat above the threshold voltage, $V_{ACQUIRE}$, transistor 40 may draw an additional current from capacitance 50 allowing current to flow through capacitance 50 in an opposite direction as that supplied by transistor 20 when $I_{40}$ was less than $I_{20}$ so that capacitor 50 begins to discharge toward zero voltage. The actual capacitance voltage in these circumstances will depend on the characteristics of transistors 20 and 40. Nevertheless, capacitance 50 will discharge to some extent which distinguishes the condition. Referring to equation (8), the values of R1 and R2 establish the threshold voltage, $V_{ACQUIRE}$.

The output of the signal detector shown in FIG. 1, namely the voltage across capacitance 50, is normally presented to a simple non-integrating secondary threshold detector 100. The secondary threshold detector may respond with an output pulse or a change of state when the voltage on capacitor 50 is reduced below say, 50% of the value of $V_{IN}$. The elasped time after the input signal $V_{IN}$ has exceeded $V_A$ until the capacitance voltage has changed to the secondary threshold voltage value is defined as the acquire time, $T_{ACQUIRE}$. A mathematical expression relating the acquire time, $T_{ACQUIRE}$, the secondary threshold detector voltage and the Modified Bessel Function of $V_A$ is as follows:

$$\frac{T_{ACQUIRE}}{C} \{R_1 - R_2 \cdot F(X)\} I_{10} = \left(\frac{50\%}{100\%} - 1\right) V_{DD} \quad (9)$$

Thus, the acquire time may be varied by a selection of capacitance value C as well as source current $I_{10}$ which, of course, is directly dependent upon the selected value of the reference potential source. It should be noted that the value of $I_{10}$ must be below a critical value in order to maintain operation of the CMOS field-effect transistors in the weak-inversion mode of operation. This current value was established in the above referred to publication and is mathematically described in equation (10).

$$I_D(\max) \leq \frac{n-1}{e} \frac{W}{L} \mu\, C_{ox}\, U_T^2 \quad (10)$$

The above expression for the channel current must be held true for each of the transistors to maintain them in the weak-inversion mode of operation. Substituting equation (10) for $I_{10}$ in equation (1), a maximum value for $V_{REF}$ may be established.

With respect to equation (8), a typical example for $V_{ACQUIRE}$ is 50 mv. That is to say, that the capacitance voltage would change from its steady state value ($V_C = V_{DD}$) when $V_A$ is greater than 50 mv. The Modified Bessel Function for F (0) is 1.00; and the Modified Bessel Function for F (50 mv/n×26 mv), when n=2, is 1.27. Thus, a value of R1 greater than 127% above R2 establishes a 50 mv "acquire" voltage amplitude for $V_A$.

In one fabrication implementation of the circuit arrangement of FIG. 1, transistors 10 and 20 are PMOS devices having an n-type conductivity channel region which is located in an n-type substrate and transistors 30 and 40 are NMOS devices having p-type conductivity channel regions which are located in p-type tubs integrated on the n-type substrate. Capacitor 50 may be a small integrated capacitance integral with the n-type substrate or may also be provided by stray capacitance of a subsequent secondary threshold circuit or the output capacitance of transistor 40 depending upon the processing techniques implemented.

Shown in FIG. 2 is an alternate circuit arrangement of FIG. 1 in which the fabrication technique is such that transistors 210 and 220 correspond to transistors 10 and 20 of FIG. 1 but are NMOS devices on a p-type substrate, and transistors 230 and 240 correspond to transistors 30 and 40 of FIG. 1 but are PMOS devices on n-type tubs integrated on the p-type substrate. The circuit of FIG. 2 is essentially the circuit of FIG. 1 diagrammatically inverted and retaining the same interconnections. Transistors 210 and 220 like transistors 10 and 20 have their gate regions connected in common and to a reference potential source and provide the current limiting function similar to transistors 10 and 20 as already described. Transistors 230 and 240 provide the variable current limiting function similar to transistors 30 and 40 as also already described. Capacitance 250 in FIG. 2 is connected across the transistor 240 channel region like capacitance 50 across transistor 40 in FIG. 1.

The circuit arrangement of FIG. 2 is such that current limit transistor 220 limits the current which can be drawn from that supplied through capacitance 250 flowing from interconnection means 211 to the drain of transistor 220. The variable current limit transistor 240 in FIG. 2 acts as a current limit for providing a discharge current path for capacitance 250 when transistor 240 can permit more current than that limited by transistor 220.

In operation, the circuit arrangement of FIG. 2 is such that if the input voltage is zero and the variable current limit function of transistor 240 cannot provide more current than the limit established by transistor 220, the voltage across the capacitance will be substantially near $V_{DD}$, and the drain-source voltage of transistor 240 is near the supply potential $V_{DD}$. As the input voltage $V_A$ increases, the gate-source voltage of transistor 240 increases resulting in increasing the current flow through transistor 240. When $V_A$ is equal to $V_{ACQUIRE}$, the current flow through transistor 240 is equal to the current flow through transistor 220, but the capacitance voltage remains at or near $V_{DD}$. However, any further increase in input voltage will result in increased current capability of transistor 240 providing a current discharge path for capacitance 250 which includes a path from capacitance 250 through interconnection means 111, through the channel of transistor 240 and back to capacitance 250. This results in the capacitance voltage decreasing and correspondingly results in the voltage between interconnection means 111 and the drain of transistor 240 to decrease and, of course, the voltage between the drain and source of transistor 230 to increase. The output voltage across capacitance 250 is similar to that expressed in equation (7) governed by the conditions in equation (8).

Figure 4:
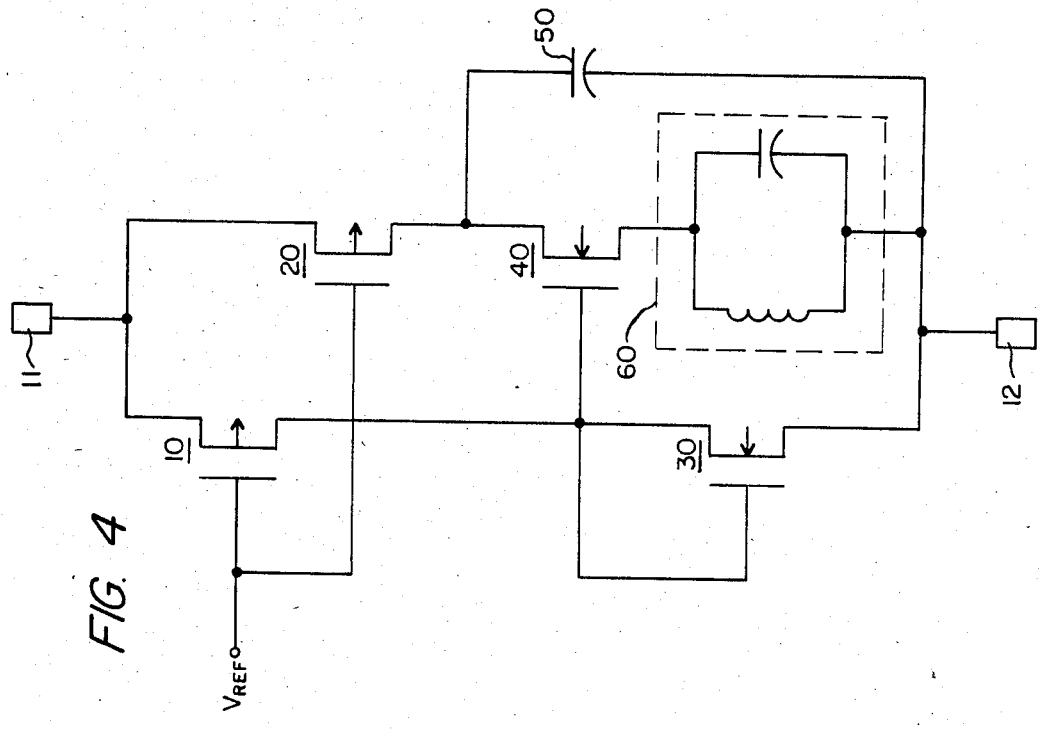
FIG. 4 shows a schematic diagram of another circuit embodiment of the present invention.
Figure 3:
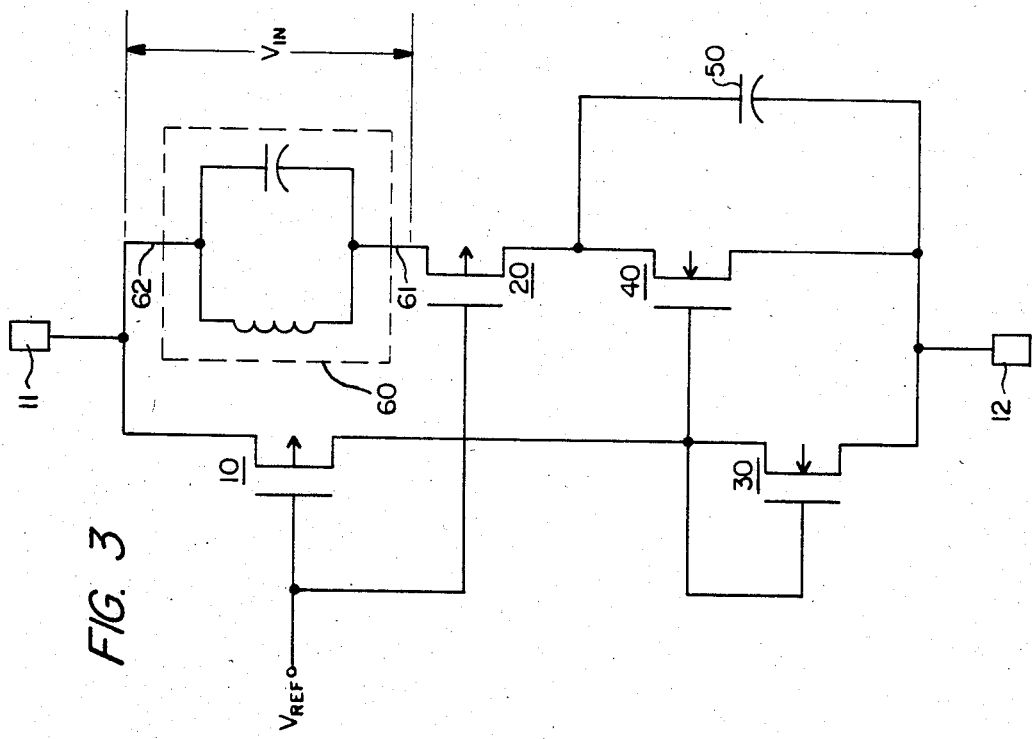
FIG. 3 shows a schematic diagram of another circuit embodiment of the present invention.

The detector circuit as so far described and illustrated in FIG. 1 may, of course, be arranged in a variety of circuit configurations. Two such configurations are shown in FIGS. 3 and 4. The circuits of FIGS. 2 and 3 have the same numeral designations for corresponding transistors shown in FIG. 1. In FIG. 3, circuit means 60 is connected between interconnection means 11 and the source of transistor 20, and the source of transistor 30 is directly connected to interconnection means 12. In this circuit arrangement, the input voltage is established between interconnection means 11 and the source of transistor 30.

With the circuit arrangement shown in FIG. 3, transistor 20 serves as a variable current limit, and transistor 40 serves as a fixed current limit. The current limit provided by transistor 20 is designed to be greater than the current limit provided by transistor 40 so that the output voltage, namely the voltage across the capacitance 50 is near $V_{DD}$ when the input voltage is zero. The gate-source voltage of transistor 20 is directly dependent upon the difference between the reference potential and the input voltage, $V_{IN}$. Therefore, the current through the channel of transistor 20 will be an exponential function of the input voltage $V_{IN}$ when operated in the weak-inversion mode of operation and will tend to reduce the current flow through transistor 20 with increasing voltage. Capacitance 50 functions in a similar manner as that shown in FIG. 1 such that the output voltage function is a factor of the Modified Bessel Function similar to that shown in equations (6), (7), and (8), and the operation of FIG. 3 is similar to that shown in FIG. 1. However, in FIG. 3, the limit current function provided by transistor 20 is such that an increase in voltage $V_{IN}$ causes the transistor 20 channel current to decrease as an exponential function of the input voltage $V_{IN}$, and the current limit function provided by transistor 40 is held constant because of the current referencing arrangement established by transistors 10 and 30. The capacitance voltage with respect to interconnection means 12 is held constant at the supply voltage $V_{DD}$ providing that the current limit established by transistor 20 and the reference potential is greater than the current drawn by the current limit function of transistor 40.

Shown in FIG. 4 is still another alternate arrangement of the invention. The circuit components of FIG. 3 having similar functions as those shown in FIG. 1 have the same numeral designations. In FIG. 3, circuit means 60 is connected between the source of transistor 40 and interconnection means 12. Like FIG. 3, the source of transistor 30 is now directly connected to interconnection means 12. In FIG. 4, transistor 20 provides the same intended function as a current limit for charging capacitance 50, and transistor 40 provides the variable current limit function for providing a discharge current path for capacitance 50.

In operation, the input voltage established between the source of transistor 40 and interconnection means 12 is such that as the input voltage increases, current through transistor 40 will decrease. Thus, the initial conditions established by the circuit parameters, namely, the reference potential and the transistor channel dimensions, are such that transistor 40 is capable of drawing current through transistor 40 in excess of that provided by the current flowing through transistor 20. In these circumstances, the voltage across capacitance 50 will be zero. On the other hand, as the input voltage increases, the gate source voltage of transistor 40, which is established by the input voltage and transistors 10 and 30, decreases and thereby restricts current flowing through the channel of transistor 40. When $V_{IN}$ reaches the "acquire" voltage of the circuit arrangement, current flowing through transistor 40 will be less than that capable of being provided by transistor 20 resulting in capacitance 50 charging and obtaining a potential substantially equal to the supply voltage $V_{DD}$.

Like FIG. 1, the circuit arrangements of FIG. 3 and FIG. 4 may also be arranged using the complimentary symmetry similar to that shown in FIG. 2. The circuit parameters of R1 and R2, namely the transistor channel widths and lengths, as well as selection of reference current $I_{10}$ and the voltage reference $V_{REF}$, may be selected from wide possibilities of combinations, all of which are intended to be within the scope of the present invention.

The embodiments of the invention in which an exclusive property or right is claimed are defined as follows:

1. A signal detector responsive to an electromagnetic input signal comprising:
   first and second interconnection means adapted for electrical connection to first and second electrical power supply means, respectively;
   capacitance means having first and second capacitance plate regions, said second capacitance plate region being electrically connected to a selected one of said first and second interconnection means;
   fixed current limiting means electrically connected to said first interconnection means and having an output electrically connected to said first capacitance plate region, said fixed current limiting means capable of limiting electrical current flowing through said fixed current limiting means output to a first current limit value;
   variable current limiting means including,
      a first metal-oxide-semiconductor field-effect transistor having a gate and a channel region, said channel region having first and second terminating regions, said first terminating region electrically connected to said first capacitance plate region,
      reference current sourcing means electrically connected to said first interconnection means and having an output for providing a reference current therethrough, said reference current sourcing means output electrically connected to said first transistor gate region,
      a second metal-oxide-semiconductor field-effect transistor having a gate region and a channel region, said channel region having first and second channel terminating regions, said first terminating region electrically connected to said first and second transistor gate regions; and
   circuit means for providing said input signal between first and second connection means thereof, said second connection means being electrically connected to said selected one of said first and second interconnection means, and said first connection means being electrically connected to said second terminating region of one of said first and second transistors, and said second terminating region of the other of said first and second transistors being electrically connected to said interconnection means connected to said second connection means.

2. The circuit of claim 1 wherein said fixed current limiting means comprises a metal-oxide-semiconductor field-effect transistor having a gate region and channel region, said channel region having first and second terminating regions, said first terminating region providing said fixed current limiting means output, said second terminating region adapted to be electrically connected to said first interconnection means, and a gate region adapted to be electrically connected to a first reference potential.

3. The circuit of claim 1 wherein
   said reference current sourcing means comprises a third metal-oxide-semiconductor field-efffect transistor including a channel region having first and second channel terminating regions thereof and a gate region, said first channel terminating region providing said reference current sourcing means output, and said third transistor second terminating region being electrically connected to said first interconnection means, and said third transistor gate region being electrically connected to a first reference potential source.

4. The circuit of claim 1 wherein said circuit means includes tuned circuit means adapted to receive an electromagnetic signal in space for providing said input signal indicative of said received signal.

5. The circuit of claim 1 wherein said first field-effect transistor is operated in the weak-inversion mode and that current flowing through said first channel region is an exponential function of said input signal amplitude.

6. The circuit of claim 3 wherein said first, second and third field-effect transistors are operated in the weak-inversion mode, and current through said first field-effect transistor first terminating region is an exponential function of the amplitude of said input signal.

7. An electromagnetic signal detector circuit comprising:

first and second interconnection means adapted for electrical connection to first and second electrical power supply means, respectively;

first and second metal-oxide field-effect transistors each having a channel region having first and second channel terminating regions and a gate region, said second channel terminating region of said first and second transistor electrically connected to said first interconnection means, and each of said gate regions thereof adapted to be electrically connected to reference potential source for establishing a current limit value of current permitted to flow through said first and second transistor channel regions;

third and fourth metal-oxide field-effect transistors each having a channel region having first and second channel terminating regions and a gate region, said gate region and said first channel terminating region of said third transistor electrically connected to said first channel terminating region of said first transistor and said fourth transistor gate region;

a capacitance means having a first capacitance plate region electrically connected to said first channel terminating regions of said second and fourth transistors, and a second capacitance plate region adapted to be electrically connected to a selected one of said first and second interconnection means; and antenna means adapted to receive electromagnetic signals from space and provide an antenna signal between first and second terminal means thereof, said second terminal means being electrically connected to said second interconection means, and said first terminal means being electrically connected to a selected one of said second channel terminating regions of said third and fourth transistors, and said second channel terminating region of the other of said third and fourth transistors being electrically connected to said second interconnecting means.

8. The circuit of claim 7 wherein said reference potential source is selected to have a value such that said first, second, third and fourth field-effect transistors are operated in the weak-inversion mode.

9. The circuit of claim 7 wherein:

said fourth transistor second terminating region is electrically connected to said second interconnection means; and said antenna means includes an induction loop having one end electrically connected to said first terminal means, and the other end thereof electrically connected to said second terminal means.

10. The circuit of claim 7 wherein said first, second, third, and fourth channel regions of each transistor have a selected channel width and length such that an effective current may pass through said capacitance means in a first direction if the amplitude of said antenna signal is above a preselected threshold value determined, in part, by said first current limit value, and in a second direction if said antenna signal amplitude is below said preselected threshold value.

11. An electromagnetic signal detector circuit comprising:

the first and second interconnection means adapted for electrical connection to first and second electrical power supply means, respectively;

capacitance means having first and second capacitance plate regions, said second capacitance plate region being electrically connected to a selected one of said first and second interconnection means;

circuit means having first and second terminal means, said circuit means including antenna means adapted to receive an electromagnetic signal in space for providing an output signal between said first and second terminal means, said second terminal means being electrically connected to said selected one of said first and second interconnection means;

fixed current limiting means electrically connected to said the other of said first and second interconnection means and having an output electrically connected to said first capacitance plate region, said fixed current limiting means capable of limiting electrical current flowing through said fixed current limiting means output to a first current limit value; and variable current limiting means electrically connected in said circuit and having an output electrically connected to said first capacitance plate region and having an input electrically connected to said first terminal means for receiving said circuit means output signal, said variable current limiting means capable of limiting current through said variable current limiting means output to a current limit value which is a function of said electromagnetic signal such that current will pass through said capacitance means in a first direction if the amplitude of said electromagnetic signal is above a selected threshold value substantially determined by said first current limit value and in a second direction if said electromagnetic signal amplitude is below said selected threshold value.

12. The circuit of claim 11 wherein said antenna means comprises an inductance means, adapted to receive electromagnetic signals in space, electrically connected between said first and second terminal means.

13. An electromagnetic signal detector circuit comprising:

first and second interconnection means adapted for electrical connection to first and second electrical power supply means, respectively;

first and second metal-oxide field-effect transistors each having a channel region having first and second channel terminating regions and a gate region, said second channel terminating region of said first transistor electrically connected to said first interconnection means, and each of said gate regions thereof adapted to be electrically connected to reference potential source for establishing a current limit value of current permitted to flow through said first and second transistor channel regions;

third and fourth metal-oxide field-effect transistors each having a channel region having first and second channel terminating regions and a gate region, said gate region and said first channel terminating region of said third transistor electrically connected to said first channel terminating region of said first transistor and said fourth transistor gate region, and said second channel terminating regions of each of said third and fourth transistor electrically connected to said second interconnection means;

a capacitance means having a first capacitance plate region electrically connected to said first channel terminating regions of said second and fourth transistors, and a second capacitance plate region adapted to be electrically connected to a selected one of said first and second interconnection means; and antenna means adapted to receive electromagnetic signals from space and provide an antenna signal between first and second terminal means thereof, said second terminal means being electrically connected to said first interconection means, and said first terminal means being electrically connected to said second channel terminating region of said second transistor.

* * * * *